United States Patent
Lin et al.

(10) Patent No.: US 9,509,256 B2
(45) Date of Patent: Nov. 29, 2016

(54) LINEARIZED GATE CAPACITANCE IN POWER AMPLIFIERS

(71) Applicant: QUALCOMM Incorporated, San Diego, CA (US)

(72) Inventors: Saihua Lin, Santa Clara, CA (US); Anup Savla, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/446,265

(22) Filed: Jul. 29, 2014

(65) Prior Publication Data

US 2016/0036393 A1   Feb. 4, 2016

(51) Int. Cl.
| | | |
|---|---|---|
| *H03F 3/45* | (2006.01) | |
| *H03F 1/32* | (2006.01) | |
| *H03F 3/19* | (2006.01) | |
| *H03F 3/21* | (2006.01) | |
| *H03F 3/24* | (2006.01) | |

(52) U.S. Cl.
CPC ............... *H03F 1/32* (2013.01); *H03F 1/3211* (2013.01); *H03F 3/19* (2013.01); *H03F 3/211* (2013.01); *H03F 3/245* (2013.01); *H03F 3/45188* (2013.01); *H03F 3/45* (2013.01); *H03F 2200/451* (2013.01); *H03F 2201/3215* (2013.01); *H03F 2203/21106* (2013.01); *H03F 2203/45296* (2013.01); *H03F 2203/45302* (2013.01); *H03F 2203/45314* (2013.01); *H03F 2203/45731* (2013.01)

(58) Field of Classification Search
CPC ........... H03F 3/45183; H03F 3/45179; H03F 3/45192; H03F 3/45188; H03F 3/45475; H03F 3/45085; H03F 3/45071; H03F 2203/45702; H03F 1/3211; H03D 7/1441; H03D 7/1433

USPC ............ 330/253, 311, 124 R, 286, 295, 296; 327/359, 563

See application file for complete search history.

(56) References Cited

U.S. PATENT DOCUMENTS

| | | | | |
|---|---|---|---|---|
| 5,568,092 | A  * | 10/1996 | Shimizu et al. | ............... 330/260 |
| 6,377,120 | B1   | 4/2002  | Hsieh | |
| 7,068,104 | B2 * | 6/2006  | Burns et al. | .................. 330/253 |
| 7,339,402 | B2 * | 3/2008  | Alenin et al. | ................. 326/109 |
| 7,696,822 | B2   | 4/2010  | Wang | |
| 8,344,808 | B2   | 1/2013  | Samavedam et al. | |

(Continued)

FOREIGN PATENT DOCUMENTS

WO    2004004307 A2    1/2004

OTHER PUBLICATIONS

Baek D., et al., "8-GHz CMOS quadrature VCO using transformer-based LC tank", IEEE Microwave and Wireless Components Letters, IEEE Service Center, New York, NY, US, vol. 13, No. 10, Oct. 1, 2003, pp. 446-448, XPO11427859, ISSN: 1531-1309, DOI: 10.1109/LMWC.2003.815685 p. 446, left-hand column, line 22-p. 448, right-hand column, line 19; figure 1(a).

(Continued)

*Primary Examiner* — Khanh V Nguyen
(74) *Attorney, Agent, or Firm* — Procopio, Cory, Hargreaves & Savitch, LLP

(57) ABSTRACT

An apparatus includes: a plurality of amplification stages, each stage comprising a cascode transistor; and a bridge circuit coupled between gate terminals of cascode transistors in two adjacent stages of the plurality of amplification stages, the bridge circuit including a plurality of diodes.

18 Claims, 7 Drawing Sheets

(56) References Cited

U.S. PATENT DOCUMENTS

| | | | |
|---|---|---|---|
| 8,629,725 B2 | 1/2014 | Scott et al. | |
| 8,680,928 B2 | 3/2014 | Jeon et al. | |
| 8,816,769 B2 * | 8/2014 | Moreira | 330/253 |
| 2008/0174378 A1 | 7/2008 | Cusmai et al. | |
| 2012/0268205 A1 * | 10/2012 | Presti | 330/253 |
| 2014/0049320 A1 | 2/2014 | Manetakis | |

OTHER PUBLICATIONS

International Search Report and Written Opinion—PCT/US2015/039241—ISA/EPO—Sep. 18, 2015.

Kim, W., et al. "An EDGE/GSM Quad-Band CMOS Power Amplifier" Samsung Electro-Mechanics, 2011 IEEE International Solid-State Circuits Conference, ISSCC, Feb. 23, 2011, 3 pages.

Onizuka, Kohie, et al. "A 1.9 GHz CMOS Power Amplifier With Embedded Linearizer to Compensate AM-PM Distortion" IEEE Journal of Solid-State Circuits, col. 47, No. 8, Aug. 2012, 8 pages.

Kampe A., et al., "An LC-VCO with One Octave Tuning Range", Proceedings of the 2005 European Conference on Circuit Theory and Design, Aug. 29, 2005, vol. 3, pp. 321-324, XP010845568, ISBN: 978-0-7803-9066-9.

Second Written Opinion from International Application No. PCT/US2015/039241, dated Jul. 11, 2016, 9 pp.

* cited by examiner

LINEARIZED GATE CAPACITANCE IN POWER AMPLIFIERS

BACKGROUND

I. Field

The present disclosure relates generally to electronics, and more specifically to power amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device typically includes a power amplifier (PA) to receive the RF signal modulated as desired for a given communication protocol and amplify this signal for transmission using an antenna. Typically, a PA can amplify both current and voltage of an incoming signal to provide the signal at a desired level. In an amplifier stage of the PA, if a phase shift through the stage is a function of the amplitude of the input signal, then that amplifier has a phase distortion, sometimes referred to as amplitude modulation-to-phase modulation (AM-to-PM) distortion. AM-to-PM distortion is a nonlinear process which degrades the amplifier's overall linearity.

In PAs formed using a complementary metal oxide semiconductor (CMOS) process, AM-to-PM distortion can cause a significant linearity problem. There are basically two sources in a CMOS PA contributing to the AM-to-PM distortion. One is the nonlinear gate capacitance of the common-source stage (CGS). Another is the nonlinear gate capacitance of the common-gate stage (CGD).

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Methods and systems for linearizing a nonlinear gate capacitance of the common-gate stage (CGD) in a power amplifier are disclosed herein. In one exemplary embodiment, the nonlinear CGD is linearized using a capacitor and a plurality of varactors. The asymmetric characteristic of the varactor between the voltage across the varactor ($V_{CD}$) and the varactor capacitance (Cv) is used. That is, the varactor capacitance is inversely proportional to the square root of the voltage across the varactor.

Figure 1:
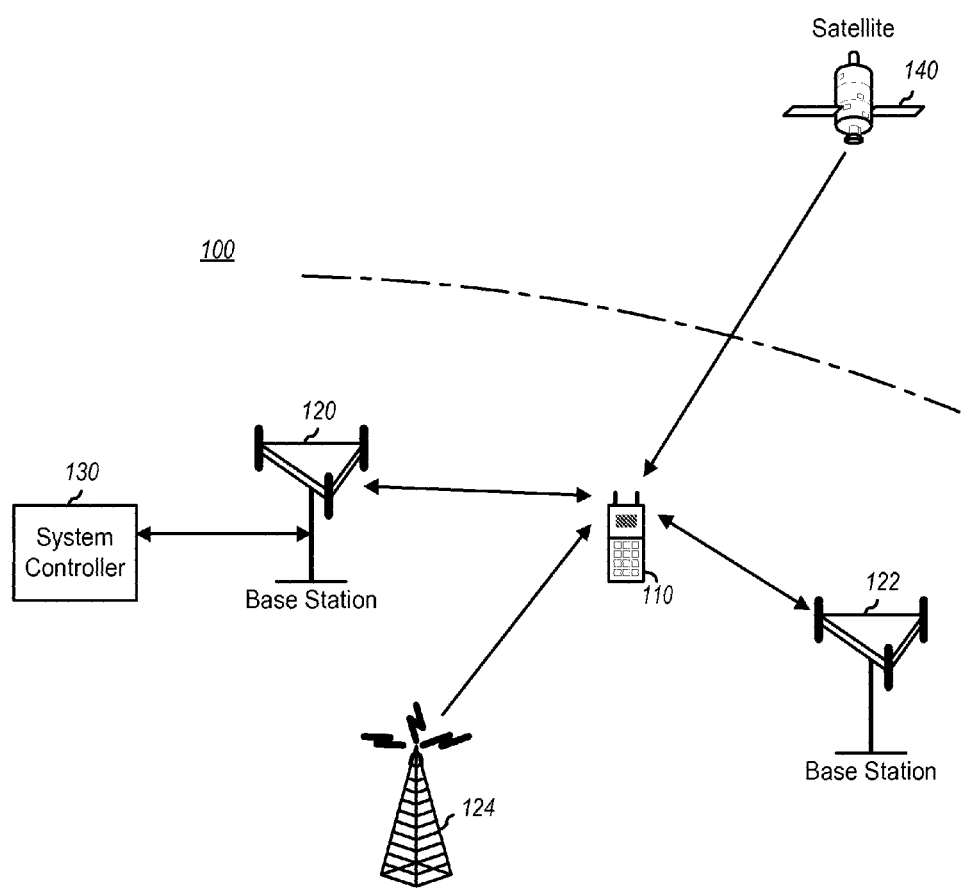
FIG. 1 shows a wireless device communicating with a wireless system.

FIG. 1 is a wireless device 110 communicating with a wireless communication system 100. Wireless system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless system 100 including two base stations 120 and 122 and one system controller 130. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 100. Wireless device 110 may also receive signals from broadcast stations (e.g., a broadcast station 124), signals from satellites (e.g., a satellite 140) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Figure 2:
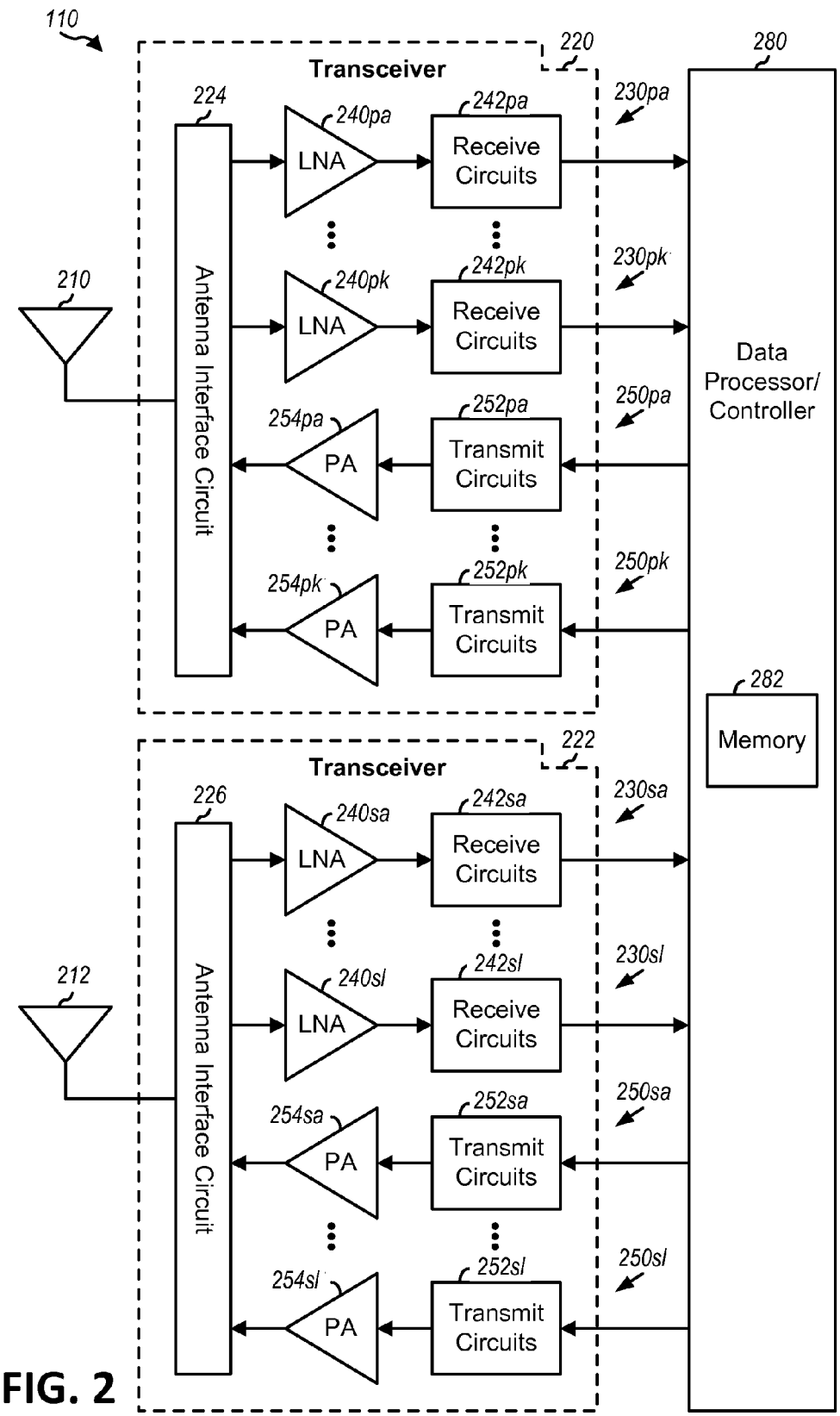
FIG. 2 is a block diagram of the wireless device shown in FIG. 1.

FIG. 2 is a block diagram of an exemplary design of wireless device 110 shown in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (k) receivers 230pa to 230pk and multiple (k) transmitters 250pa to 250pk to support multiple frequency bands, multiple radio technologies, carrier aggregation, etc. Transceiver 222 includes multiple (l) receivers 230sa to 230sl and multiple (l) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250pa.

FIG. 2 also shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
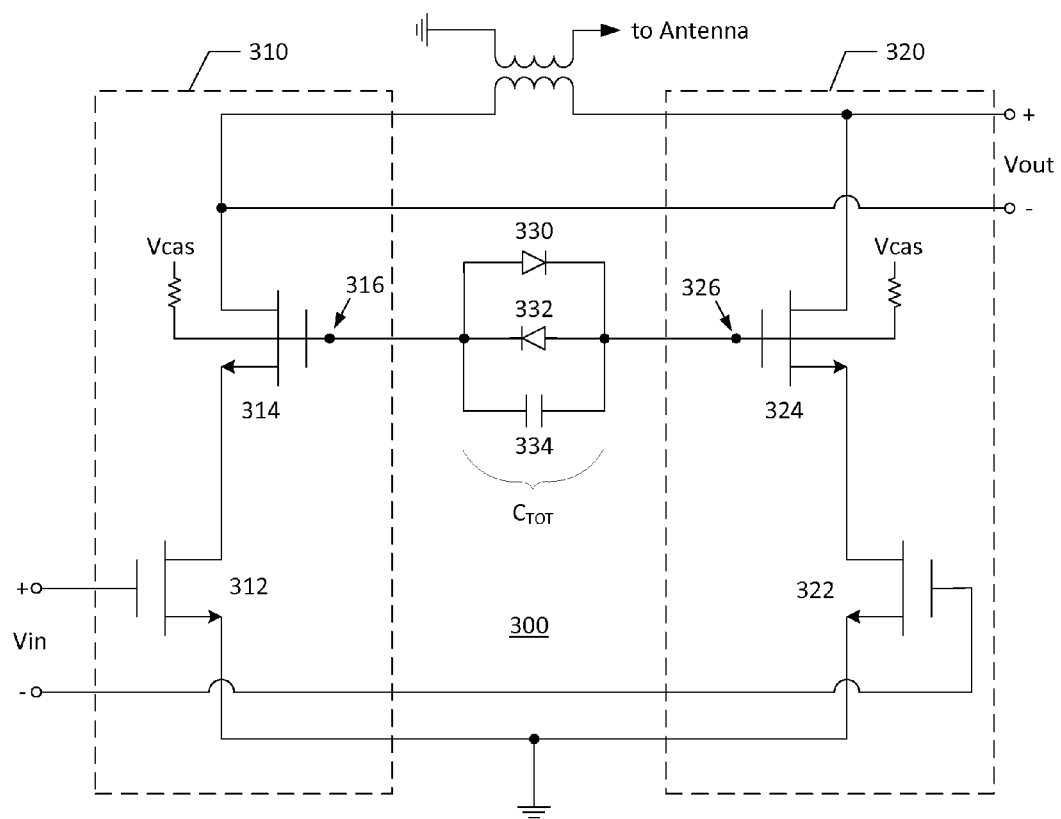
FIG. 3 is a schematic diagram of a power amplifier (PA) in accordance with one exemplary embodiment of the present disclosure.

FIG. 3 is a schematic diagram of a power amplifier (PA) 300 in accordance with one exemplary embodiment of the present disclosure. In one exemplary embodiment, the PA 300 is configured similarly to PA 254 shown in FIG. 2. In FIG. 3, the PA 300 includes two stages 310, 320. The first stage 310 includes a common-source gain transistor 312 and a common-gate cascode transistor 314 which are implemented with N-channel metal oxide semiconductor (NMOS) transistors. However, transistors 312, 314 may be implemented with transistors of other types. The gate terminal of the transistor 312 receives a first input ($V_{in}^{+}$) of the differential inputs of the PA 300, while the source terminal of transistor 312 is coupled to the ground voltage. In the illustrated embodiment of FIG. 3, the source terminal of the cascode transistor 314 is coupled to the drain terminal of the gain transistor 312, while the gate terminal 316 of transistor 314 is coupled to the cascode bias voltage $V_{cas}$. In other exemplary embodiments, the gate terminal 316 of transistor 314 may also be biased to the ground voltage. The drain terminal of the cascode transistor 314 provides a first output ($V_{out}^{-}$) of the differential outputs of the PA 300.

The second stage 320 is configured similarly to the first stage 310. The second stage 320 includes a common-source gain transistor 322 and a common-gate cascode transistor 324 which are implemented with NMOS transistors. However, transistors 322, 324 may be implemented with transistors of other types. The gate terminal of the gain transistor 322 receives a second input ($V_{in}^{-}$) of the differential inputs of the PA 300, while the source terminal of transistor 322 is coupled to the ground voltage. In the illustrated embodiment of FIG. 3, the source terminal of the cascode transistor 324 is coupled to the drain terminal of transistor 322, while the gate terminal 326 of transistor 324 is also coupled to the cascode bias voltage $V_{cas}$. In other exemplary embodiments, the gate terminal 326 of transistor 324 may also be biased to the ground voltage. The drain terminal of the cascode transistor 324 provides a second output ($V_{out}^{+}$) of the differential outputs of the PA 300. Further, in the illustrated embodiment of FIG. 3, the two stages 310, 320 are connected or bridged at the gate terminals 316, 326 of the cascode transistors 314, 324 through a capacitor 334 and a plurality of varactors 330, 332. In FIG. 3, the varactors 330, 332 are configured in a parallel configuration with each other and in opposite directions, which are also in parallel to capacitor 334.

In operation, as the output voltage swing ($V_{out}$) of the PA 300 increases, some of the swing couples into the gate terminals 316, 326 of the common-gate cascode transistors 314, 324, which partially enter into a linear region. The entry into the linear region causes the average gate capacitance (CGD) to increase in a PA configured with only a capacitor (e.g., capacitor 334 only, without varactors 330, 332) between the two gates 316, 326, and the increase in CGD causes an AM-to-PM distortion. However, in the PA 300 shown in FIG. 3, varactors 330, 332 are provided in parallel to the capacitor 334 in the bridge between the two stages 310, 320 (i.e., varactors 330, 332 are provided between the gate terminals 316, 326 of transistors 314, 324). Because of the asymmetric characteristic of a varactor, the total capacitance ($C_{TOT}$) in parallel in the bridge is reduced when the output swing is increased. Thus, by reducing the total capacitance ($C_{TOT}$) in the gate terminals 316, 326 of the cascode transistors 314, 324, the AM-to-PM distortion is reduced. In contrast, at the low output swing, varactors 330, 332 causes the total capacitance ($C_{TOT}$) to increase to a large value and may even double the value of capacitor 334 because of its asymmetric characteristic. Thus, at the low output swing, a significant increase in the total capacitance provides an effective ground for the gates of the cascode transistors, and maintains the desired high gain in the PA.

It should be noted that varactors 330, 332 are used in this configuration of the PA 300 because of the asymmetric characteristic which causes the total capacitance in the bridge to decrease during the increased output swing, while the total capacitance increases to a large value during the low output swing. However, other elements that produce similar characteristics can be used in place of the varactors.

For example, certain types of diodes may behave similarly to the varactors so that those types of diodes can be used instead.

Figure 4:
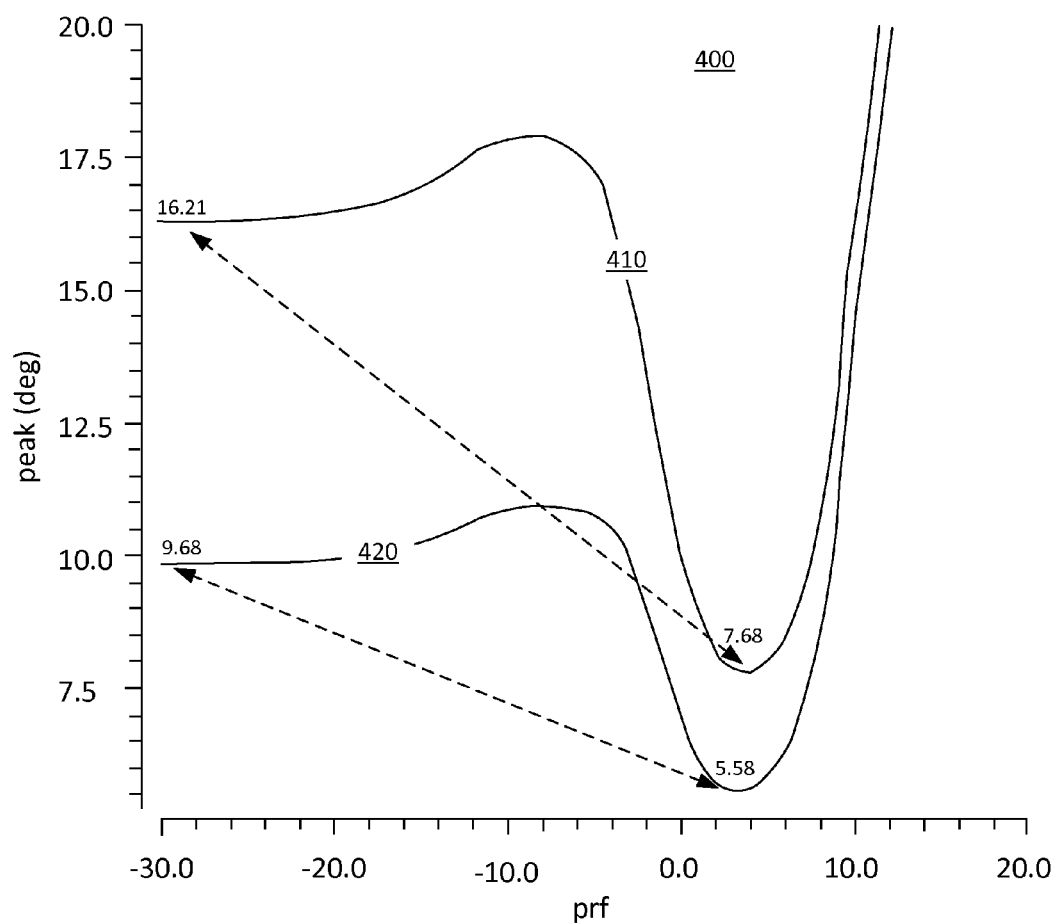
FIG. 4 is a plot showing the phase shift through the stages of the PA for two different configurations.

FIG. 4 is a plot 400 showing a phase shift through the stages of the PA (e.g., PA 300) for two different configurations. Graph 410 shows the phase shift for a configuration with only a capacitor coupled between the gates of the cascode transistors, while graph 420 shows the phase shift for another configuration with stacked capacitor and varactors coupled in parallel between the gates of the cascode transistors as configured in FIG. 3. The graphs 410, 420 are plotted as the peak phase shift in degrees versus the radio frequency power (PRF) or input RF power. The graph 410, showing the phase shift for the capacitor only case, starts out at 16.21 degrees and dips down to 7.68 degrees to result in an AM-to-PM phase distortion of 8.53 degrees. The graph 420, showing the phase shift for the stacked capacitor-and-varactors case, starts out at 9.68 degrees and dips down to 5.58 degrees to result in an AM-to-PM phase distortion of 4.10 degrees. Thus, the plot 400 shows the improvement of almost 52% in the AM-to-PM distortion when varactors are added. Although the exact numbers may vary depending on the setup of the test, the design of the PA 300 as configured in FIG. 3 provides a significant improvement in the AM-to-PM distortion for the large signal while maintaining the desired high gain for the small signal.

Figure 5:
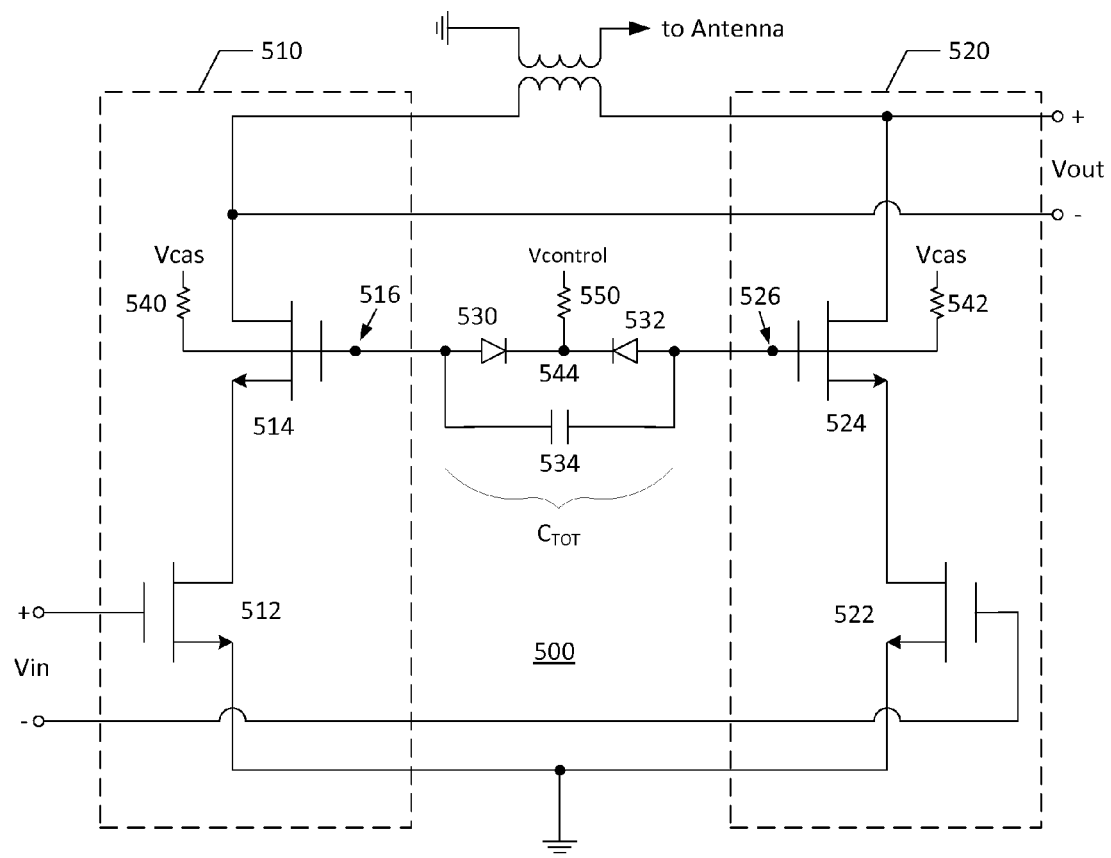
FIG. 5 is a schematic diagram of a power amplifier (PA) in accordance with another exemplary embodiment of the present disclosure.

FIG. 5 is a schematic diagram of a power amplifier (PA) 500 in accordance with another exemplary embodiment of the present disclosure. In FIG. 5, the PA 500 includes two stages 510, 520 which are substantially similar to the two stages 310, 320 in FIG. 3. Further, the two stages 510, 520 are connected or bridged at the gate terminals 516, 526 of the cascode transistors 514, 524 through a capacitor 534 and a plurality of varactors 530, 532. However, in the illustrated embodiment of FIG. 5, the varactors 530, 532 are in series with each other and in opposite directions. Capacitor 534 is coupled in parallel to the serially-connected varactors 530, 532. Further, a control terminal 544, which provides a control voltage ($V_{control}$) through resistor 550, is placed between the two varactors to provide a bias that allows mode control of the PA 500. For example, in a high gain mode, the varactors 530, 532 are positively biased (i.e., $V_{control}$ is biased to be less than $V_{cas}$) such that current flows from $V_{cas}$ through resistors 540, 542 to the gate terminals 516, 526 and through the varactors 530, 532 to the control terminal 544. Thus, this configuration provides a good AC ground at the gate terminals 516, 526 of the cascode transistors 514, 524. In a high linearity mode, the varactors 530, 532 are negatively biased (i.e., $V_{control}$ is biased to be greater than $V_{cas}$) such that no current flows through the varactors 530, 532. Thus, this configuration provides a reduction in the CGD. Additional embodiments can be configured to adaptively change $V_{control}$ according to the output swing.

Figure 6:
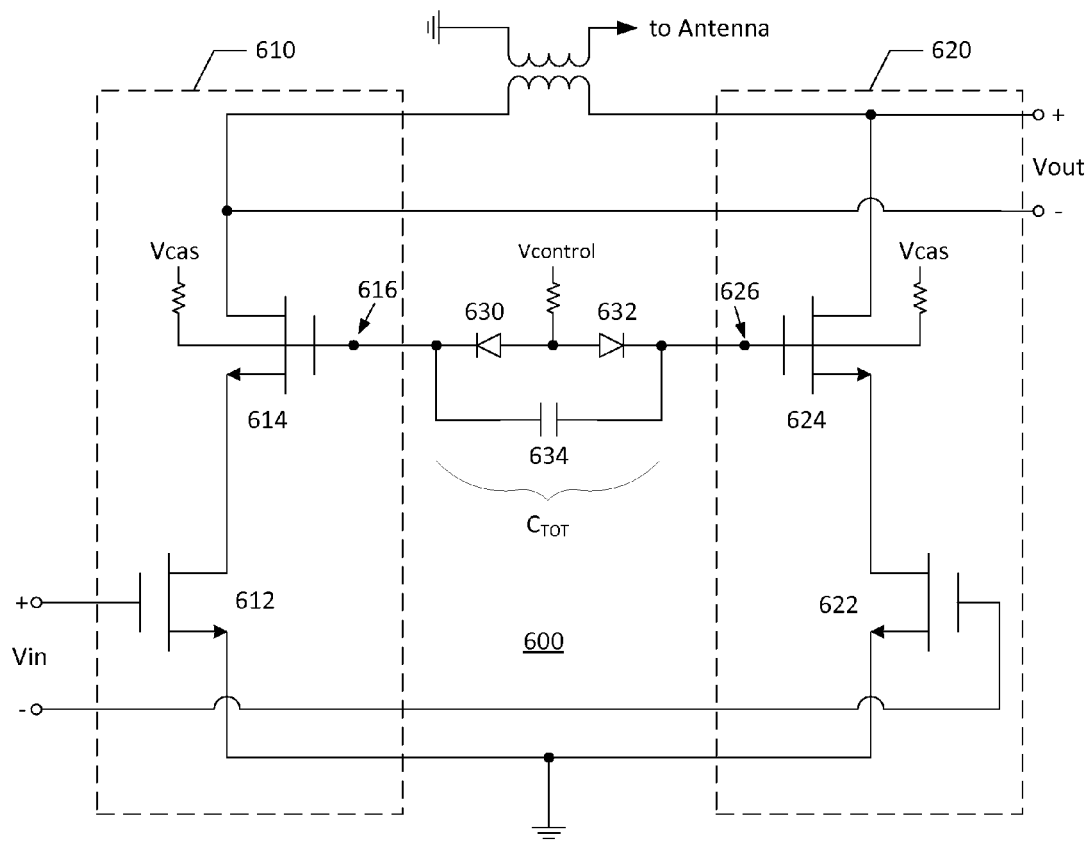
FIG. 6 is a schematic diagram of a power amplifier (PA) in accordance with another exemplary embodiment similar to the PA embodiment shown in FIG. 5, but with directions of varactors reversed from the varactors of FIG. 5.

FIG. 6 is a schematic diagram of a power amplifier (PA) 600 in accordance with another exemplary embodiment similar to the PA embodiment 500 shown in FIG. 5, but with directions of varactors 630, 632 reversed from varactors 530, 532 of FIG. 5. Accordingly, in a high gain mode, the varactors 630, 632 are positively biased by biasing $V_{control}$ to be greater than $V_{cas}$ to provide a good AC ground at the gate terminals 616, 626 of the cascode transistors 614, 624. Correspondingly, when the varactors 630, 632 are to be negatively biased in a high linearity mode, $V_{control}$ is biased to be less than $V_{cas}$ to provide a reduction in CGD.

Figure 7:
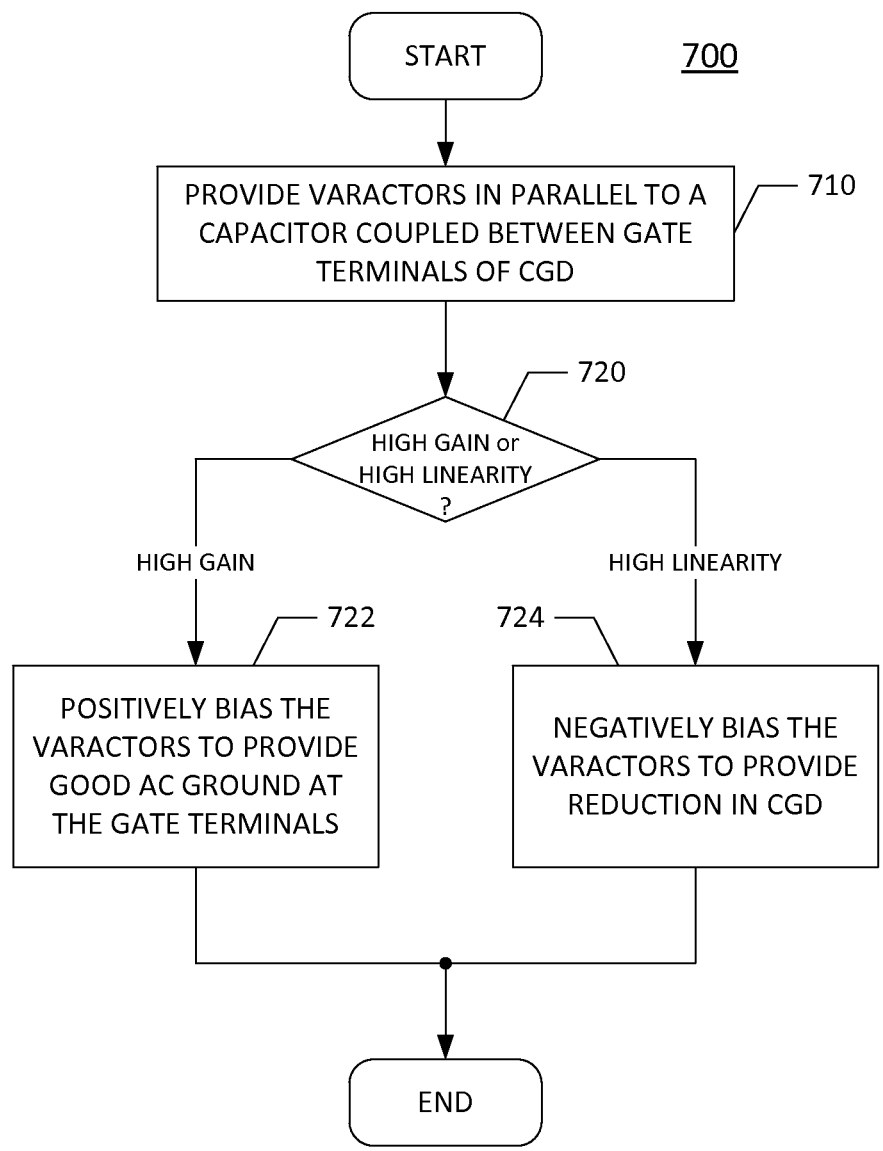
FIG. 7 is an exemplary flow diagram of a process for linearizing a nonlinear gate capacitance CGD of the common-gate stage in a PA according to one exemplary embodiment of the present disclosure.

FIG. 7 is an exemplary flow diagram of a process 700 for linearizing a nonlinear gate capacitance CGD of the common-gate stage in a PA according to one exemplary embodiment of the present disclosure. Initially, varactors (e.g., varactors 530, 532) are provided in parallel, at step 710, to a capacitor (e.g., capacitor 534) coupled between the gate terminals (e.g., terminals 516, 526) of the common-gate stage (e.g., transistors 514, 524). A determination is then made, at step 720, whether the linearization process is for a high gain mode or high linearity mode. For a high gain mode, the varactors (e.g., 530, 532) are positively biased, at step 722, to provide a good AC ground at the gate terminals (e.g., 516, 526) of the common-gate stage (e.g., transistors 514, 524). For a high linearity mode, the varactors (e.g., 530, 532) are negatively biased, at step 724, to provide a reduction in CGD.

The power amplifiers described herein may be implemented on one or more ICs, analog ICs, RFICs, mixed-signal ICs, ASICs, printed circuit boards (PCBs), electronic devices, etc. The power amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the power amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a plurality of amplification stages, each stage comprising a cascode transistor; and
a bridge circuit coupled between gate terminals of cascode transistors in two adjacent stages of the plurality of amplification stages, the bridge circuit including a plurality of diodes and a capacitor in parallel with the plurality of diodes.

2. The apparatus of claim 1, the plurality of diodes is arranged in a parallel configuration, but in opposite directions.

3. The apparatus of claim 1, further comprising
a bias terminal coupled to a gate terminal of the cascode transistor in said each stage, the bias terminal configured to provide a bias voltage during a high linearity mode and a ground voltage during a high gain mode.

4. The apparatus of claim 3, the plurality of diodes is arranged in a series configuration, but in opposite directions facing each other, and each diode is coupled to the gate terminal of the cascode transistor in each of two adjacent stages.

5. The apparatus of claim 4, further comprising
a control terminal coupled to a connecting point between the plurality of diodes, the control terminal, in conjunction with the bias terminal, is configured to provide a mode control of the plurality of diodes.

6. The apparatus of claim 3, the plurality of diodes is arranged in a series configuration, but in opposite directions facing away from each other, and each diode is coupled to the gate terminal of the cascode transistor in each of two adjacent stages.

7. The apparatus of claim 1, further comprising:
a gain transistor in said each stage; and
a differential pair of input terminals, each input terminal coupled to a gate terminal of the gain transistor.

8. The apparatus of claim 1, further comprising
a differential pair of output terminals, each output terminal coupled to a drain terminal of the cascode transistor and configured to output a differential pair of output signals.

9. The apparatus of claim 1, further comprising
a transformer coupled to the differential pair of output terminals, the transformer configured to couple the differential pair of output signals to an antenna interface circuit.

10. The apparatus of claim 1, the plurality of amplification stages comprises a plurality of power amplifiers.

11. The apparatus of claim 10, further comprising:
a data processor configured to generate output signals; and
a plurality of transmit circuits configured to receive the output signals from the data processor and output radio frequency signals to the plurality of power amplifiers.

12. An apparatus comprising:
a plurality of amplification stages, each stage comprising a cascode transistor; and
a bridge circuit coupled between gate terminals of cascode transistors in two adjacent stages of the plurality of amplification stages, the bridge circuit including a plurality of varactors and a capacitor in parallel with the plurality of varactors.

13. An apparatus comprising:
means for coupling a bridge circuit between gate terminals of a common-gate stage of an amplifier, the bridge circuit including a plurality of diodes and a capacitor in parallel with the plurality of diodes;
means for positively biasing the bridge circuit for a high gain mode; and
means for negatively biasing the bridge circuit for a high linearity mode.

14. The apparatus of claim 13, the plurality of diodes is arranged in a parallel configuration, but in opposite directions.

15. The apparatus of claim 13, further comprising
means for coupling a bias terminal to each of the gate terminals of the common-gate stage, bias terminals configured to enable biasing of the plurality of diodes.

16. The apparatus of claim 15, said means for positively biasing comprising
means for providing a ground voltage to the bias terminals.

17. The apparatus of claim 15, said means for negatively biasing comprising
means for providing a bias voltage to the bias terminals.

18. The apparatus of claim 15, further comprising
means for coupling a control terminal to a connecting point between the plurality of diodes, the control terminal, in conjunction with the bias terminals, is configured to provide a mode control of the plurality of diodes.

* * * * *